United States Patent
Iwashita et al.

(10) Patent No.: US 12,158,552 B2
(45) Date of Patent: Dec. 3, 2024

(54) NUCLEAR REACTION DETECTION DEVICE, METHOD AND PROGRAM

(71) Applicants: Nippon Telegraph and Telephone Corporation, Tokyo (JP); National University Corporation Hokkaido University, Sapporo (JP); National University Corporation Tokai National Higher Education and Research System, Nagoya (JP)

(72) Inventors: Hidenori Iwashita, Musashino (JP); Gentaro Funatsu, Musashino (JP); Michihiro Furusaka, Sapporo (JP); Takashi Kamiyama, Sapporo (JP); Hirotaka Sato, Sapporo (JP); Yoshiaki Kiyanagi, Nagoya (JP)

(73) Assignees: NATIONAL UNIVERSITY CORPORATION HOKKAIDO UNIVERSITY, Sapporo (JP); NIPPON TELEGRAPH AND TELEPHONE CORPORATION, Tokyo (JP); NATIONAL UNIVERSITY CORPORATION TOKAI NATIONAL HIGHER EDUCATION AND RESEARCH SYSTEM, Nagoya (JP)

( * ) Notice: Subject to any disclaimer, the term of this patent is extended or adjusted under 35 U.S.C. 154(b) by 332 days.

(21) Appl. No.: 17/624,689

(22) PCT Filed: Jul. 3, 2020

(86) PCT No.: PCT/JP2020/026274
§ 371 (c)(1),
(2) Date: Jan. 4, 2022

(87) PCT Pub. No.: WO2021/002469
PCT Pub. Date: Jan. 7, 2021

(65) Prior Publication Data
US 2022/0260735 A1 Aug. 18, 2022

(30) Foreign Application Priority Data
Jul. 4, 2019 (JP) .................................. 2019-125192

(51) Int. Cl.
*G01T 1/00* (2006.01)
*G01T 1/24* (2006.01)

(52) U.S. Cl.
CPC ..................................... *G01T 1/245* (2013.01)

(58) Field of Classification Search
CPC ........................................................ G01T 1/34
See application file for complete search history.

(56) References Cited

U.S. PATENT DOCUMENTS

2015/0364216 A1* 12/2015 Buck ....................... G11C 7/02
250/394

FOREIGN PATENT DOCUMENTS

CN 106842282 6/2017
WO WO 2018/186155 10/2018

OTHER PUBLICATIONS

Tarrillo et al., "Neutron Cross-Section of N-Modular Redundancy Technique in SRAM-Based FPGAs," IEEE Transactions on Nuclear Science, Aug. 2014, 61(4):1558-1566.
(Continued)

*Primary Examiner* — Dani Fox
(74) *Attorney, Agent, or Firm* — Fish & Richardson P.C.

(57) ABSTRACT

A nuclear reaction detection device includes an FPGA (Field Programmable Gate Array) 100 which is arranged in an environment in which particle radiation is incident, and includes a user circuit 101 configured to output a value different from that in a normal state, if an SEU (Single Event
(Continued)

Upset) occurs in a semiconductor element included in the FPGA, and an SEF detection unit 210 which detects that an abnormal operation (SEF) has occurred in the user circuit based on the output value from the user circuit 101 of the FPGA 100.

7 Claims, 6 Drawing Sheets

(56) References Cited

OTHER PUBLICATIONS

Ibe, "Terrestrial Radiation Effects in ULSO Devices and Electronic Systems," IEEE, John Wiley & Sons, Ltd., 2015, pp. 84-105, 24 pages.

Violante et al., "A new hardware/software platform and a new 1/E neutron source for soft error studies: Testing FPGAs at the ISIS facility," IEEE Transactions on Nuclear Science, 2007, 54(4):1184-1189.

\* cited by examiner

NUCLEAR REACTION DETECTION DEVICE, METHOD AND PROGRAM

CROSS-REFERENCE TO RELATED APPLICATIONS

This application is a National Stage application under 35 U.S.C. § 371 of International Application No. PCT/JP2020/026274, having an International Filing Date of Jul. 3, 2020, which claims priority to Japanese Application Serial No. 2019-125192, filed on Jul. 4, 2019. The disclosure of the prior application is considered part of the disclosure of this application, and is incorporated in its entirety into this application.

TECHNICAL FIELD

The present invention relates to a technique for specifying an energy of a particle beam, and measuring an SEU cross section in the energy of the particle.

BACKGROUND ART

In order to measure the energy dependency of an SEU (Single Event Upset) cross section, the SEU cross section was conventionally measured by irradiating an object with a particle beam of a specific energy. For example, CYRIC (Cyclotron and Radioisotope Center) and TSL (The Svedberg Lab.) are known as monochromatic/quasi-monochromatic neutron sources, and by generating only the specific energy, the SEU cross section according to the particles of the energy can be obtained (Non-patent document 1).

An SEU in this case means an event in which a single particle (a neutron, proton, heavy particle, or the like) is incident on an LSI (Large Scale Integration) such as a memory, and data (a bit) stored in the LSI is inverted by charge generated by the nuclear reaction. An SEU is also called a soft error.

Further, an SEU cross section means a scale representing a rate at which particles cause an SEU to occur. It is assumed that the number of SEUs that have occurred when a semiconductor is irradiated with particles of a fluence $\phi$ [n/cm$^2$] (total number of particles incident on a unit area) is N. Then, the SEU cross section is represented by the following formula (1).

[Formula 1]

$$SEU \text{ Cross section} = \frac{N}{\Phi} \quad \text{formula (1)}$$

Meanwhile, as a conventional method for detecting the energy of particle radiation, there is a time-of-flight method. The time-of-flight method is a method in which the velocity of a particle is calculated by measuring the time required for flight of a certain distance, and this is converted into the particle energy. As an example of the use of this method, for example, a time-of-flight method for a neutron as a kind of particle radiation will be described. The energy E of a neutron is proportional to the square of the velocity v of the neutron, and is expressed by the following formula (2). Here m is the mass of the neutron.

[Formula 2]

$$E = \frac{1}{2}mv^2 \quad \text{formula (2)}$$

Therefore, the energy of the neutron can be specified by generating a pulse neutron by using an accelerator or a nuclear reactor, installing a detector at a fixed distance, and measuring the difference (the time-of-flight) between the time at which the pulse neutron is generated and the time at which the neutron is detected by the detector. In this way, the time-of-flight method is widely used as a method for obtaining neutron energy.

PRIOR ART DOCUMENT

Non-Patent Document

Non-patent document 1: Eishi H. Ibe, "Terrestrial Radiation Effects in ULSI Devices and Electronic Systems", pp. 84-105, John Wiley & Sons Singapore Pte. Ltd, 2015.

SUMMARY OF THE INVENTION

Problem to be Solved by the Invention

If a conventional monochromatic source is used as a method for specifying the energy of a particle which causes a soft error, especially in the case of a neutron, only the intermittent energy is generated, and it has been difficult to measure a continuous SEU cross section.

The particles that cause the SEUs to occur are fast particles on the MeV order. FIG. 6 shows the relationship between the neutron energy and the time-of-flight in the case of a 20-m flight of a neutron. In this way, the time-of-flight of a high-energy particle is on the ns-μs order. Meanwhile, as a method for detecting the SEU, there is a method for detecting a bit error in data by using an error-detecting code (CRC (Cyclic Redundancy Check), Parity, ECC (Error Correction Code), and the like). However, for example, in the case of an SRAM (Static Random Access Memory), the operating frequency is 1 GHz at the fastest, and the number of bits that can be read in 1 clock cycle is 64 bits at most. Therefore, about 15 μs is required to read out 1 Mbit. Further, a configuration RAM of an FPGA (field programmable gate array) can detect an error by using an error-detecting code, but several msec to several tens of msec are required to check the entire area. Thus, it has been difficult to detect the time-of-flight of high-energy particles by using an error-detecting code.

The present invention is made in view of the above described problems, and an object of the present invention is to provide a nuclear reaction detection device, a method, and a program which can perform detection at high speed.

Means for Solving the Problem

To achieve the above described object, a nuclear reaction detection device according to the present invention includes an FPGA (Field Programmable Gate Array) that is arranged in an environment in which particle radiation is incident, and includes a user circuit, the user circuit being configured to output a value different from that in a normal state, if an SEU (Single Event Upset) occurs in a semiconductor element included in the FPGA, and an abnormal operation detection unit that detects that an abnormal operation has occurred in the user circuit based on the value that is output from the user circuit in the FPGA.

Effect of the Invention

According to the present invention, the user circuit of the FPGA is configured such that the output behaves abnormally due to the occurrence of an SEU. Thus, the occurrence of an SEU can be detected in the order of the operation clock of the FPGA 100. In other words, the occurrence of an SEU can be detected at a high speed, and the measurement accuracy of the occurrence time of the SEU thereby becomes high.

MODE FOR CARRYING OUT THE INVENTION

Figure 1:
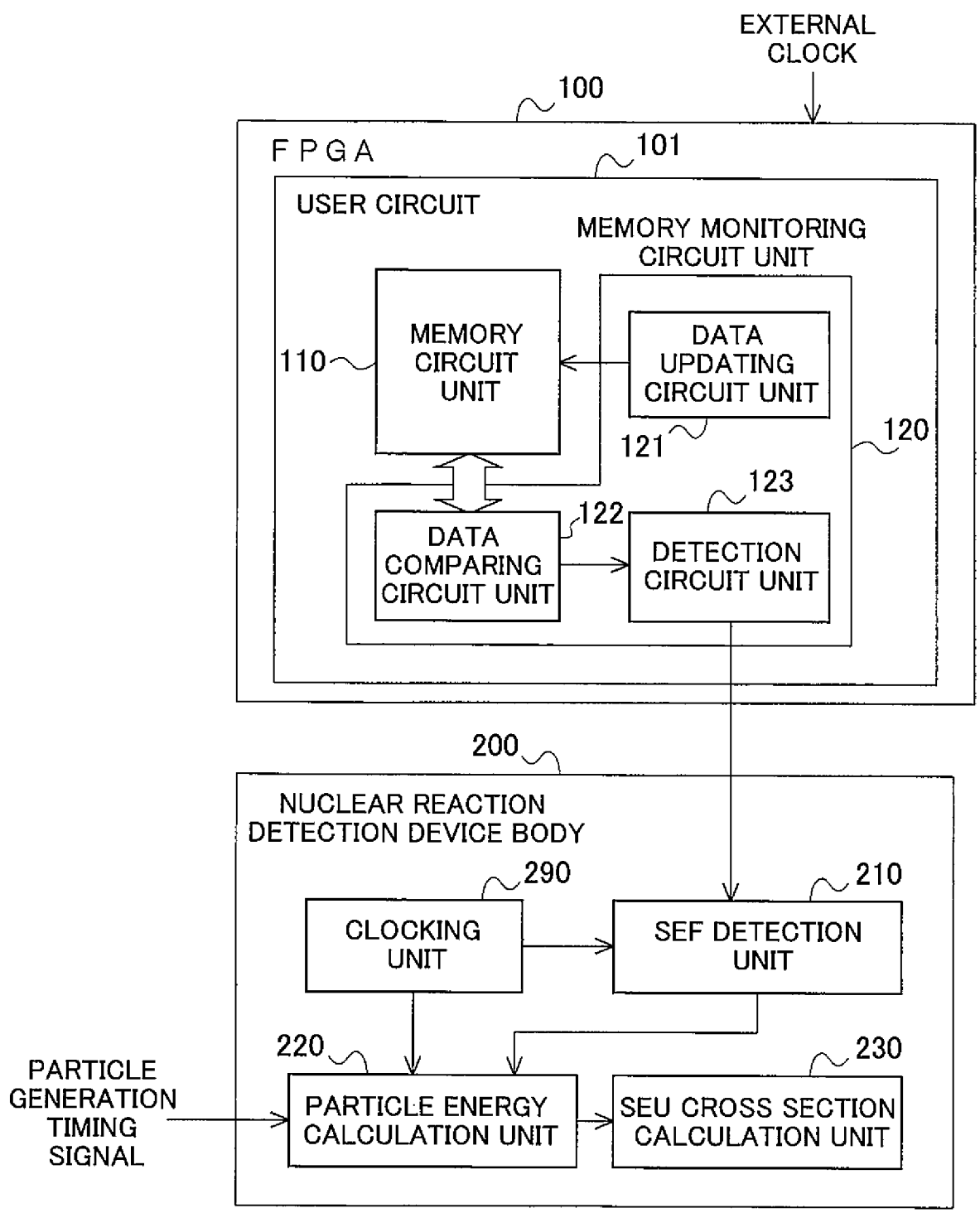
FIG. 1 is a diagram illustrating a configuration of a nuclear reaction detection device according to an embodiment of the present invention.
Figure 2:
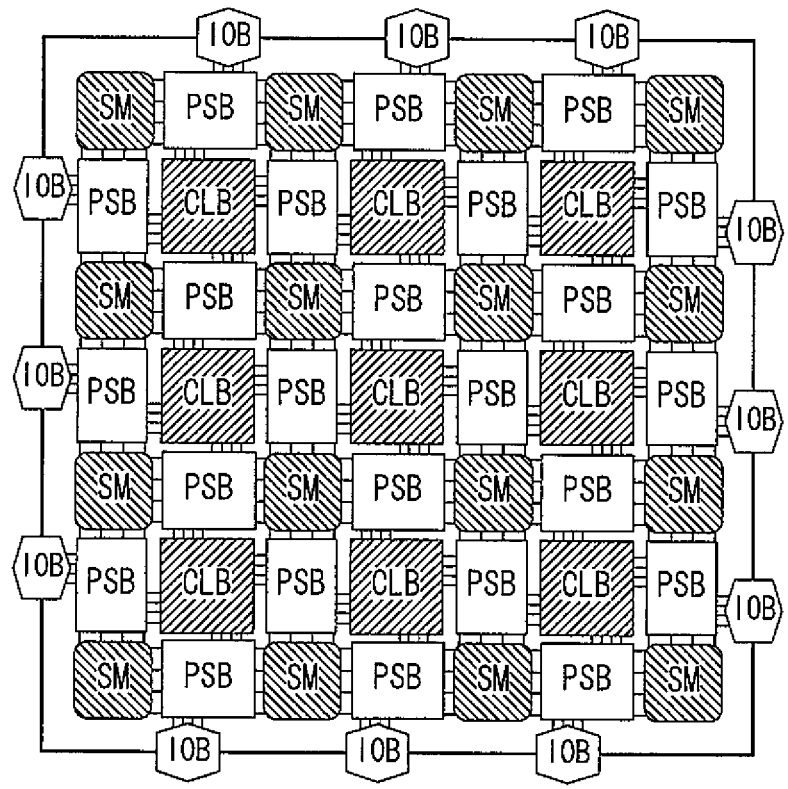
FIG. 2 is a diagram for explaining an internal structure of an FPGA.
Figure 3:
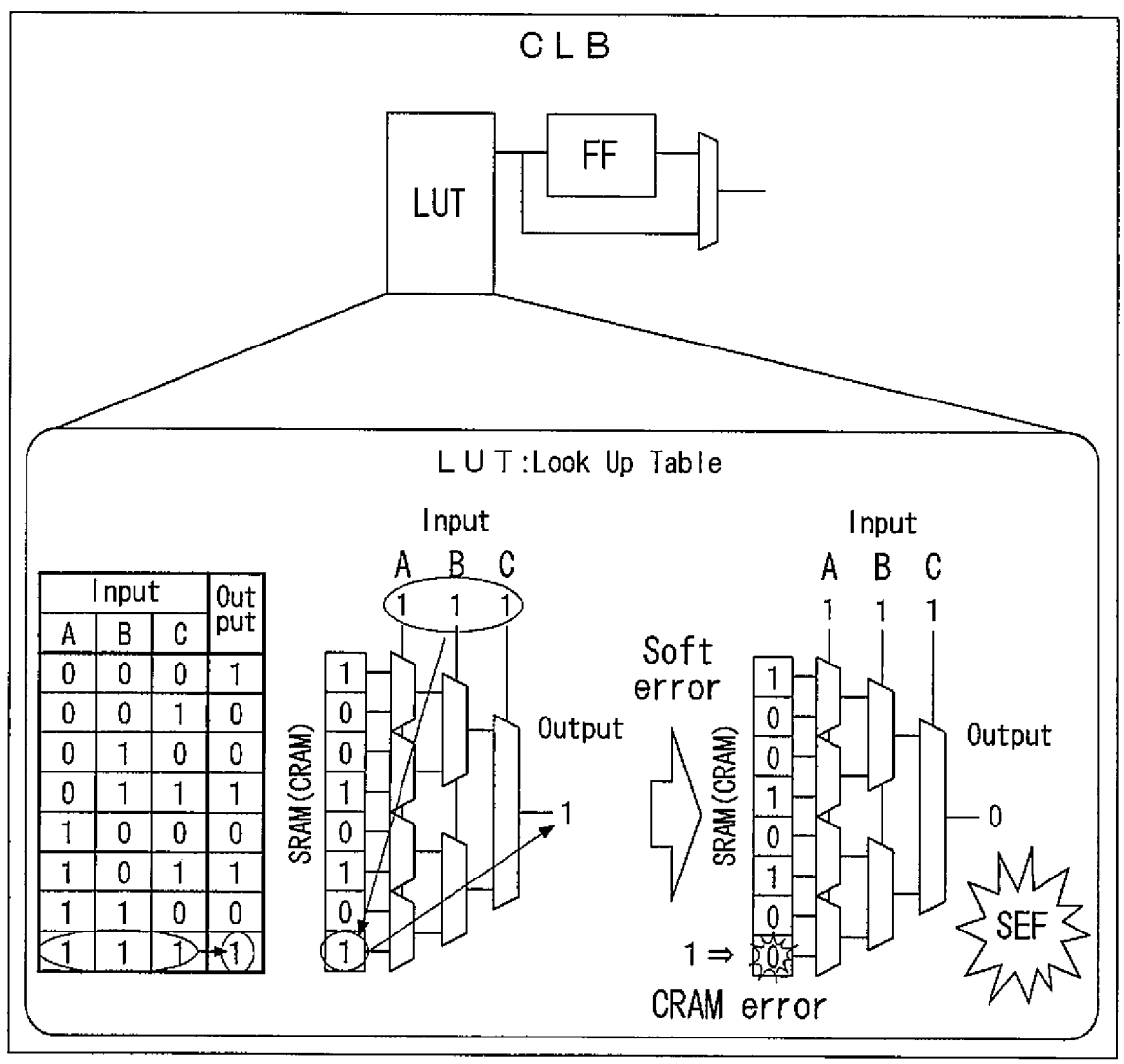
FIG. 3 is a diagram for explaining an internal structure of a CLB of an FPGA, and the occurrence of an SEF.
Figure 4:
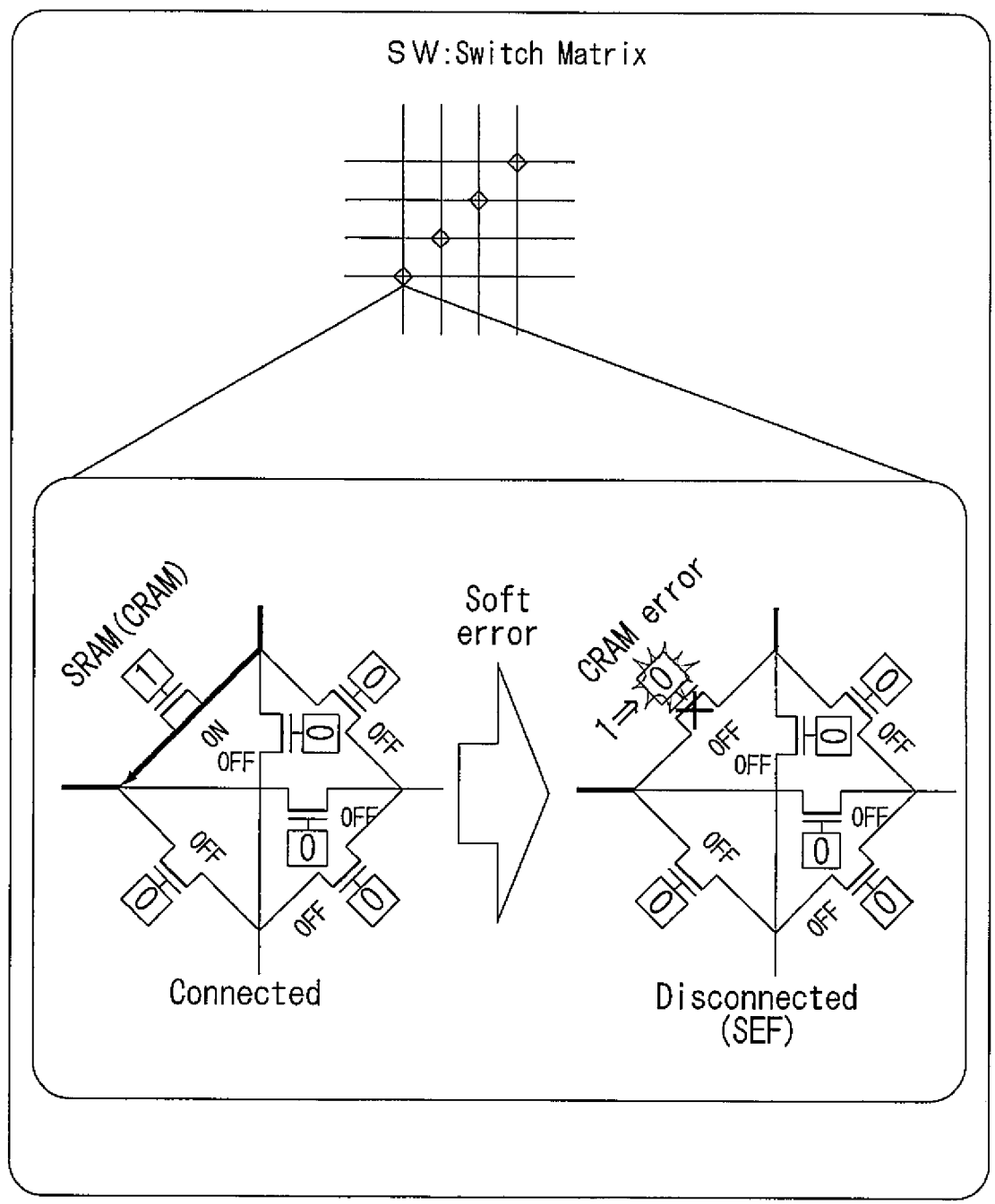
FIG. 4 is a diagram for explaining an internal structure of an SM in an FPGA, and the occurrence of an SEF.
Figure 5:
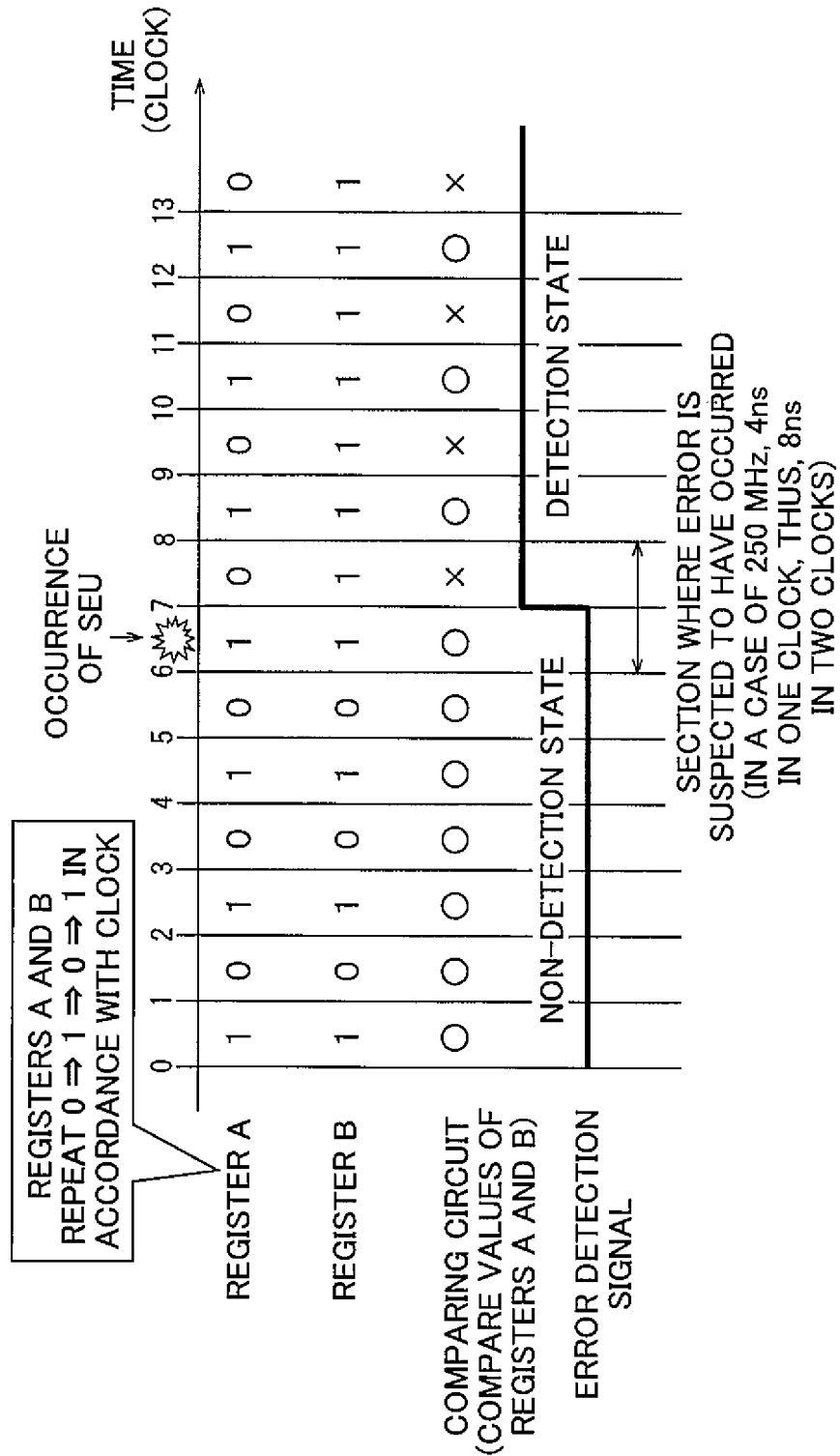
FIG. 5 is a diagram for explaining operations of a memory monitoring circuit in an FPGA.

A nuclear reaction detection device according to an embodiment of the present invention will be described with reference to FIGS. 1 to 5. FIG. 1 is a configuration diagram of a nuclear reaction detection device according to an embodiment of the present invention. FIG. 2 is a diagram for explaining an internal structure of an FPGA. FIG. 3 is a diagram for explaining an internal structure of a CLB of an FPGA, and the occurrence of an SEF. FIG. 4 is a diagram for explaining an internal structure of an SM of an FPGA, and the occurrence of an SEF. FIG. 5 is a diagram for explaining operations of a memory monitoring circuit in an FPGA.

In this embodiment, by detecting an error caused by an SEU in the order of nanoseconds, the energy of the particle generating the SEU is specified using a time-of-flight method, and an SEU cross section of the energy is measured from the fluence of the particle with which an object has been irradiated. More specifically, as shown in FIG. 1, the SEU is detected by using a user circuit 101 of an SRAM-type FPGA 100. The FPGA of the present embodiment is arranged in an environment in which particle radiation is incident, and is formed with a user circuit configured to output a value different from that in a normal state, if an SEU occurs in a semiconductor element included in the FPGA.

First, the general internal structure of the FPGA, and the principle of detecting an SEU will be described. As shown in FIG. 2, the FPGA includes CLBs (Configuration Logic Block) which constitute the logic, IOBs (Input Output Block) which realize input/output functions, SMs (Switch Matrix) which are connection elements for realizing the connection between elements, and PSBs (Programmable Switch Box).

As shown in FIG. 3, each CLB includes an LUT (Look Up Table), and an FF (Flip Flop). The CLB can control an output value based on data of a CRAM (Configuration RAM) made of the SRAM of the LUT, and can configure various basic circuits. If an SEU occurs in the CRAM in the LUT, a circuit having a design different from the design intended by the user is formed, and a malfunction occurs.

As shown in FIG. 4, each SM (switch matrix) freely sets a wiring path by means of a pass-transistor. The pass-transistor being on/off is controlled by the CRAM made of the SRAM. If an SEU occurs in the CRAM, the wiring has a design different from the design intended by the user.

As described above, if an SEU occurs in the CLBs as logic units and the CRAMs of the SMs as connection units, the circuit immediately becomes an erroneous circuit, and may operate differently from the circuit operation designed by the user. This abnormal operation is called an SEF (Soft error failure) in this case. The detection of an SEF enables a high-speed detection of an SEU.

An example of the user circuit 101 capable of detecting an SEF will be described with reference to FIG. 1. As is well known, the user circuit 101 is configured by externally writing configuration data for the construction of the user circuit into the FPGA 100.

In the example of FIG. 1, the user circuit 101 includes a memory circuit unit 110, and a memory monitoring circuit unit 120. The memory monitoring circuit unit 120 monitors each piece of data included in the memory circuit unit 110 in an operation clock cycle of the FPGA 100, detects that a value of any of the pieces of data has changed, and outputs a detection result. This configuration enables the detection of an SEF in the order of the operation clock of the FPGA 100. Note that the frequency of the operation clock of the FPGA 100 does not necessarily coincide with an external clock input to the FPGA 100.

As a more specific example, the memory monitoring circuit unit 120 includes a data updating circuit unit 121, a data comparing circuit unit 122, and a detection circuit unit 123. The data updating circuit unit 121 changes all pieces of data of the memory circuit unit 110 with the same value and in a clock cycle. The data comparing circuit unit 122 compares the individual pieces of data of the memory circuit unit 110. The detection circuit unit 123 detects that the individual data values are no longer the same based on the comparison result by the data comparing circuit unit 122, and outputs a detection result.

As a more specific example, the memory circuit unit 110 includes as many registers as possible. Further, in the data updating circuit unit 121, a circuit is constructed for causing each register of the memory circuit unit 110 to repeat $0 \rightarrow 1 \rightarrow 0 \rightarrow 1$ at the maximum operating frequency (the timing can be converged). The data comparing circuit unit 122 compares and monitors the plurality of registers of the memory circuit unit 110. An example of the data comparing circuit unit 122 is an XOR circuit.

If an SEU occurs, the registers do not function correctly, and thus the value does not change. The detection circuit unit 123 can detect an SEU at high speed by detecting an operation in which an output value of the data comparing circuit unit 122 does not change. The detection circuit unit 123 outputs an error detection signal after detecting the SEU. FIG. 5 illustrates an example of operations of the detection circuit unit 123. In FIG. 5, only two registers A and B included in the memory circuit unit 110 are illustrated to simplify the explanation. As illustrated in FIG. 5, the user circuit 101 can detect the occurrence of an SEU with a resolution on the order of nanoseconds. That is, the circuit can detect that an SEU has occurred within a time range of two clocks.

As illustrated in FIG. 1, the nuclear reaction detection device according to the present embodiment includes a nuclear reaction detection device body 200 that is electrically connected to the FPGA 100, and is arranged in an environment protected from the particle radiation. The nuclear reaction detection device body 200 includes an SEF detection unit 210, a particle energy calculation unit 220, an SEU cross section calculation unit 230, and a clocking unit 290. The nuclear reaction detection device body 200 is constituted from an information processor. The individual units of the nuclear reaction detection device body 200 may be mounted in any form, and may be constituted by dedicated hardware, may be constituted by a general-purpose device installed with a program, or may be constituted by any combination thereof.

The SEF detection unit 210 (an abnormal operation detection unit) detects the occurrence of an abnormal operation in the user circuit 101, that is, the occurrence of an SEF, based on an output value from the user circuit 101 of the FPGA 100. After detecting the occurrence of the SEF based on the error detection signal from the detection circuit unit 123, the SEF detection unit 210 recognizes the time at which the SEF occurred by acquiring the current time clocked by the clocking unit 290. The SEF detection unit 210 stores the occurrence of the SEF, and the time at which the SEF occurred in predetermined storage means (not illustrated) or outputs the same to an external device (not illustrated).

The particle energy calculation unit 220 calculates particle energy by using the time-of-flight method based on the occurrence time of the abnormal operation measured by the SEF detection unit 210. Specifically, the particle energy calculation unit 220 calculates the difference between the time at which the acquired error detection signal from the detection circuit unit 123 is transmitted to the SEF detection unit 210, that is, the occurrence time of the SEF, and the time at which particles are generated. Accordingly, the particle energy calculation unit 220 can calculate the energy of the particles that generates the SEU and causes the SEF to occur. In order to acquire the time at which the particles are generated, the particle energy calculation unit 220 may detect the input of a particle generation timing signal from the external device, and acquire the current time at the time of detection from the clocking unit 290. The particle energy calculation unit 220 stores the calculated particle energy in a predetermined storage unit (not illustrated) or outputs the energy to the external device (not illustrated). The time at which the particles are generated may be acquired from the external device, or stored in advance in a predetermined storage unit, and acquired from the storage unit.

The SEU cross section calculation unit 230 calculates the SEU cross section of a CRAM. Specifically, the SEU cross section calculation unit 230 calculates the SEU cross section based on the number of occurrences of abnormal operations detected by the SEF detection unit 210. However, not all SEUs that occur in a CRAM cause an SEF. That is, an SEF may not be detected even if the SEU occurs in a CRAM that does not affect the circuit operation. SEFs vary depending on the user design, and thus it is not necessary to acquire the SEU cross section of an SEF, but it is necessary to acquire the SEU cross section of a CRAM.

Figure 6:
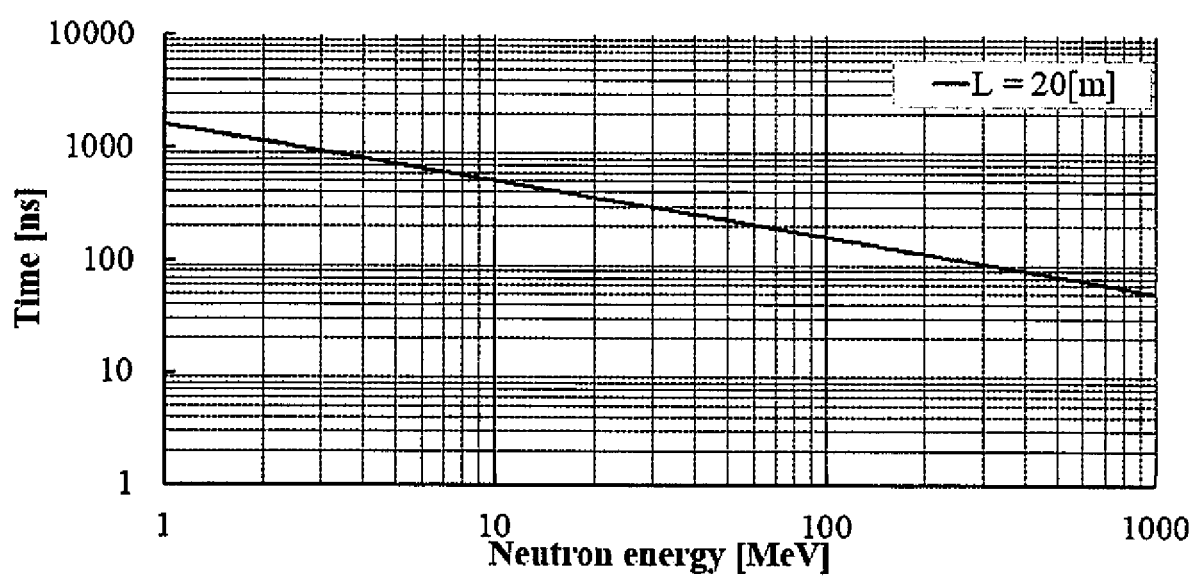
FIG. 6 is a diagram showing the relationship between neutron energy and time-of-flight.

To obtain an absolute value of the SEU cross section of a CRAM, correction is necessary. In order to perform the correction, the number of SEUs including CRAMs which are not used (N) is calculated by using a CRC check function of the CRAMs, the SEF count distribution is set as the SEF probability distribution p(t), and the SEF energy probability distribution p(E) is calculated from the relationship between the energy and an arrival time illustrated in FIG. 6. By multiplying N by p(E), an $N_{SEU}(E)$ absolute value which serves as the distribution of the number of SEU occurrences for each energy can be calculated. Finally, the SEU cross section for each energy is calculated from the fluence φ(E) for each energy measured with a neutron measuring device.

As described above, according to the nuclear reaction detection device of the present embodiment, the user circuit 101 of the FPGA 100 is configured such that the output behaves abnormally due to the occurrence of an SEU. Thus, the occurrence of an SEU can be detected in the order of the operation clock of the FPGA 100. In other words, the occurrence of an SEU can be detected at a high speed, and the measurement accuracy of the occurrence time of the SEU thereby becomes high. This enables high-accuracy measurement of the energy of the particles causing an event such as an SEU. Further, the occurrence rate of an event such as the SEU cross section for each continuous particle energy can be measured with high accuracy.

The particle energy calculation unit 210 and the SEU cross section calculation unit 220 in the nuclear reaction detection device body 200 are any components, and the nuclear reaction detection device body 200 may have only one of them.

The nuclear reaction detection device body 200 may further include an energy measuring unit for measuring the energy spectrum of a pulse particle source (pulse neutron source) by using the acquired occurrence rate of an event such as the SEU cross section.

The nuclear reaction detection device body 200 may further include energy detection means for detecting the energy in position information. The position information means a physical position (a spatial position) in the FPGA 100 at which an SEU has occurred. The position information can be acquired by, after detecting the occurrence of the SEU, comparing the configuration data for the user circuit construction with the user circuit 101, or by scanning data at each address of the memory circuit unit 110 to determine whether the data is appropriate.

Example

An example of measuring the SEU cross section with neutrons will be given.

In a neutron irradiation field, a neutron flux and a neutron fluence are measured by the neutron measuring device during the irradiation of the semiconductor. A neutron generation target is irradiated with proton pulses accelerated by an accelerator to generate neutrons. The moment at which the proton pulse hits the neutron generation target is the time at which the neutrons are generated, and this corresponds to t=0 in the time-of-flight method. The time-of-flight is measured by taking the difference between a timing signal indicating t=0 and a timing signal for the detection of an SEF, and this can be converted into neutron energy.

The device uses the user circuit in the FPGA to construct the register, and causes the register to be operated at an operation clock. An object is irradiated with neutrons, and the time-of-flight and the SEF count are observed. In the measurement of the total SEU cross section for the entire CRAM area, the total number of CRAM errors is observed. From the above, the SEU cross section is calculated.

Although one embodiment of the present invention has been described in detail above, the present invention is not limited to the above described embodiment, and various improvements and modifications may be made without departing from the gist of the present invention.

For example, the present invention can be applied not only to an SRAM-type FPGA, but also to an EEPROM-type FPGA. Further, the particle radiation is not limited to neutron radiation, and the present invention can be applied to other particle radiation, as long as an SEU occurs when other particle radiation is incident on the FPGA.

The user circuit 101 is constructed of the memory circuit unit 110 and the memory monitoring circuit unit 120. However, another circuit may be adopted as long as an output value of another circuit changes owing to the occurrence of an abnormal operation due to the occurrence of an SEU.

The above described nuclear reaction detection device body 200 can use a general-purpose computer system. For example, the computer system includes a CPU (Central Processing Unit, a processor), a memory, a storage (HDD: Hard Disk Drive, SSD: Solid State Drive), a communication device, an input device, and an output device. The memory and storage are storage devices. In this computer system, each function of the nuclear reaction detection device body 200 is realized by the CPU executing a predetermined program loaded in the memory. Further, the nuclear reaction detection device body 200 may be implemented by a single computer, or alternatively by a plurality of computers. Further, the nuclear reaction detection device body 200 may be a virtual machine mounted on a computer. The program for the nuclear reaction detection device body 200 can be stored in a computer-readable recording medium such as an HDD, SSD, USB (Universal Serial Bus) memory, CD (Compact Disc), or DVD (Digital Versatile Disc), or alternatively the program may be distributed via a network.

EXPLANATION OF THE REFERENCE NUMERALS

100 FPGA
101 User circuit
110 Memory circuit unit
120 Memory monitoring circuit unit
121 Data updating circuit unit
122 Data comparing circuit unit
123 Detection circuit unit
200 Nuclear reaction detection device body
210 SEF detection unit
220 Particle energy calculation unit
230 SEU cross section calculation unit
290 Clocking unit

The invention claimed is:

1. A nuclear reaction detection device comprising:
an FPGA (Field Programmable Gate Array) that is arranged in an environment in which particle radiation is incident, and includes a user circuit, the user circuit being configured to output a value different from that in a normal state, if an SEU (Single Event Upset) occurs in a semiconductor element included in the FPGA;
an abnormal operation detection unit, comprising one or more hardware processors, that detects that an abnormal operation has occurred in the user circuit based on the value that is output from the user circuit in the FPGA; and
a particle energy calculation unit configured to calculate particle energy by using a time-of-flight method based on an occurrence time of the abnormal operation measured by the abnormal operation detection unit.

2. The nuclear reaction detection device according to claim 1, wherein
the user circuit includes a memory circuit unit, and a memory monitoring circuit unit that monitors each of all pieces of data included in the memory circuit unit in a clock cycle of the FPGA, and detects a change in a value of any of the pieces of data to output a detection result.

3. The nuclear reaction detection device according to claim 2, wherein
the memory monitoring circuit unit includes a data updating circuit unit that changes all pieces of data of the memory circuit unit with a same value and in the clock cycle, a data comparing circuit unit that compares individual pieces of data of the memory circuit unit, and a detection circuit unit that detects that values of the individual pieces of data are no longer the same based on a comparison result by the data comparing circuit unit, and outputs a detection result.

4. The nuclear reaction detection device according to claim 1, comprising:
an SEU cross section calculation unit that calculates an SEU cross section based on a number of occurrences of the abnormal operation detected by the abnormal operation detection unit.

5. The nuclear reaction detection device according to claim 1, wherein
the FPGA is an SRAM-type FPGA.

6. A nuclear reaction detection method comprising:
a step of arranging, in an environment in which particle radiation is incident, an FPGA (Field Programmable Gate Array) that includes a user circuit, the user circuit being configured to output a value different from that in a normal state, if an SEU (Single Event Upset) occurs in a semiconductor element included in the FPGA;
an abnormal operation detection step of detecting that an abnormal operation has occurred in the user circuit based on the output value from the user circuit in the FPGA; and
a particle energy calculation step of calculating particle energy by using a time-of-flight method based on an occurrence time of the abnormal operation that has been detected.

7. A computer readable recording medium storing a nuclear reaction detection program, wherein executing of the nuclear reaction detection program causes one or more computer to perform operations comprising:
detecting that an abnormal operation has occurred in a user circuit based on a output value from a user circuit in a FPGA (Field Programmable Gate Array), wherein the FPGA that is arranged in an environment in which particle radiation is incident, and includes the user circuit, the user circuit being configured to output a value different from that in a normal state, if an SEU (Single Event Upset) occurs in a semiconductor element included in the FPGA; and
calculating particle energy by using a time-of-flight method based on an occurrence time of the abnormal operation that has been detected.

* * * * *